United States Patent
Yamamoto et al.

(10) Patent No.: US 11,957,052 B2
(45) Date of Patent: Apr. 9, 2024

(54) THERMOELECTRIC MATERIAL, MANUFACTURING METHOD OF THERMOELECTRIC MATERIAL, THERMOELECTRIC CONVERSION ELEMENT, AND THERMOELECTRIC CONVERSION MODULE

(71) Applicants: KABUSHIKI KAISHA TOSHIBA, Tokyo (JP); TOSHIBA MATERIALS CO., LTD., Yokohama (JP)

(72) Inventors: Shinichi Yamamoto, Fujisawa (JP); Masami Okamura, Yokohama (JP); Nobuaki Nakashima, Yokohama (JP); Masanori Mizobe, Yokohama (JP)

(73) Assignees: Kabushiki Kaisha Toshiba, Tokyo (JP); Toshiba Materials Co., Ltd., Yokohama (JP)

( * ) Notice: Subject to any disclaimer, the term of this patent is extended or adjusted under 35 U.S.C. 154(b) by 392 days.

(21) Appl. No.: 16/256,276

(22) Filed: Jan. 24, 2019

(65) Prior Publication Data
US 2020/0028059 A1 Jan. 23, 2020

Related U.S. Application Data

(63) Continuation of application No. PCT/JP2017/027476, filed on Jul. 28, 2017.

(30) Foreign Application Priority Data

Jul. 28, 2016 (JP) ................ 2016-148104

(51) Int. Cl.
*H10N 10/01* (2023.01)
*B22F 3/15* (2006.01)
(Continued)

(52) U.S. Cl.
CPC ........... *H10N 10/01* (2023.02); *B22F 3/15* (2013.01); *B22F 3/24* (2013.01); *B22F 9/04* (2013.01);
(Continued)

(58) Field of Classification Search
CPC . B22F 3/15; H01L 35/12; H01L 35/14; H01L 35/16; H01L 35/34; H10N 10/00–857
(Continued)

(56) References Cited

U.S. PATENT DOCUMENTS 5,824,561 A * 10/1998 Kishi ............... H01L 35/34
438/55
2006/0053969 A1 3/2006 Harada et al.
(Continued)

FOREIGN PATENT DOCUMENTS

JP 2000-244026 A1 9/2000
JP 2001-189495 A1 7/2001
(Continued)

OTHER PUBLICATIONS

Heinrich Hohl, et al., "Efficient Dopants for ZrNiSn-based Thermoelectric Materials," *J. Phys.: Condens. Matter*, 11 (1999), pp. 1697-1709.
(Continued)

*Primary Examiner* — Bach T Dinh
(74) *Attorney, Agent, or Firm* — BURR PATENT LAW, PLLC

(57) ABSTRACT

According to one embodiment, a thermoelectric material are provided. The thermoelectric material includes a sintered body formed of p-type and n-type thermoelectric materials for the thermoelectric conversion element. The thermoelectric materials have a MgAgAs type crystal structure as a main phase. An area ratio of internal defects of the thermoelectric materials for one thermoelectric conversion element
(Continued)

is 10% or less in terms of a total area ratio of defective portions in a scanning surface according to ultrasonic flaw detection in a thickness direction of the thermoelectric material. No defect having a length of 800 μm or more is present at any vertex of chips of the thermoelectric materials.

18 Claims, 1 Drawing Sheet

(51) Int. Cl.
   *B22F 3/24*    (2006.01)
   *B22F 9/04*    (2006.01)
   *C22C 12/00*   (2006.01)
   *C22C 30/04*   (2006.01)
   *H10N 10/853*  (2023.01)
(52) U.S. Cl.
   CPC .............. *C22C 12/00* (2013.01); *C22C 30/04* (2013.01); *H10N 10/853* (2023.02)
(58) Field of Classification Search
   USPC ................................................ 136/200–242
   See application file for complete search history.

(56) References Cited

U.S. PATENT DOCUMENTS

| | | | |
|---|---|---|---|
| 2007/0125416 A1 | 6/2007 | Iwanade et al. | |
| 2010/0193001 A1 | 8/2010 | Hirono et al. | |
| 2011/0297203 A1* | 12/2011 | Salvador | H10N 10/01 |
| | | | 136/239 |
| 2013/0213447 A1 | 8/2013 | Hayashi | |
| 2015/0122302 A1* | 5/2015 | Sawa | C22C 1/0433 |
| | | | 419/33 |

FOREIGN PATENT DOCUMENTS

| | | |
|---|---|---|
| JP | 2002-111084 A1 | 4/2002 |
| JP | 2005-317603 A1 | 11/2005 |
| JP | 2007-158191 A1 | 6/2007 |
| JP | 2010-001506 A1 | 1/2010 |
| JP | 4497981 B2 | 7/2010 |
| JP | 4521215 B2 | 8/2010 |
| JP | 2013-191838 A1 | 9/2013 |
| WO | 2004/049464 A1 | 6/2004 |
| WO | 2009/008127 A1 | 1/2009 |
| WO | 2014/014126 A1 | 1/2014 |

OTHER PUBLICATIONS

K. Mastronardi, et al., "Antimonides with the Half-Heusler Structure: New Thermoelectric Materials," *Applied Physics Letters*, vol. 74, No. 10, Mar. 8, 1999, pp. 1415-1417.

"Metal Data Book," Edited by Japan Metal Society, Maruzen Co., Ltd., Apr. 1, 1997, pp. 13-14 (with English translation).

"Handbook of Steel Materials," Edited by Japan Metal Society and Japan Steel Association, Maruzen Co., Ltd., Jan. 20, 1985, pp. 55, 946 and 947 (with English translation).

International Search Report and Written Opinion (Application No. PCT/JP2017/027476) dated Oct. 24, 2017.

* cited by examiner

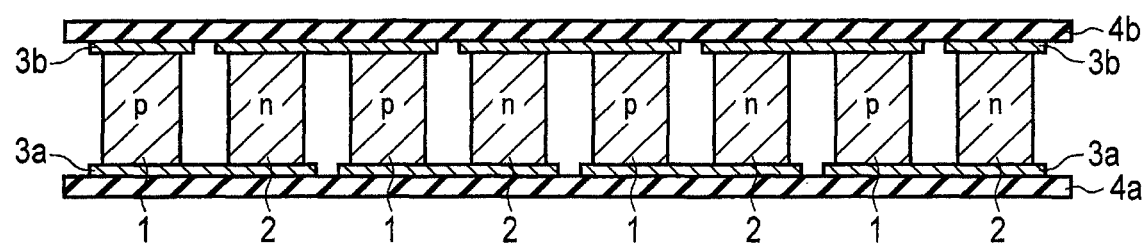

THERMOELECTRIC MATERIAL, MANUFACTURING METHOD OF THERMOELECTRIC MATERIAL, THERMOELECTRIC CONVERSION ELEMENT, AND THERMOELECTRIC CONVERSION MODULE

CROSS-REFERENCE TO RELATED APPLICATIONS

This application is a Continuation Application of PCT Application No. PCT/JP2017/027476, filed Jul. 28, 2017 and based upon and claiming the benefit of priority from Japanese Patent Application No. 2016-148104, filed Jul. 28, 2016, the entire contents of all of which are incorporated herein by reference.

FIELD OF THE INVENTION

Embodiments of the present invention relate to a thermoelectric material having a MgAgAs type crystal structure, a manufacturing method of a thermoelectric material, a thermoelectric conversion element using the thermoelectric material, and a thermoelectric conversion module using the thermoelectric conversion element.

BACKGROUND OF THE INVENTION

In recent years, with growing awareness of global environmental issues, there has been an increasing interest in a thermoelectric cooling element using the Peltier effect as fluorocarbon-free cooling. Also, from the global warming issue, there has been an increasing interest in a thermoelectric conversion element directly converting unused waste heat energy into electric energy to reduce the amount of emissions of carbon dioxide.

A performance index Z of a thermoelectric material is represented by the following formula (1).

$$Z = \alpha^2 \sigma / \kappa (= Pf/\kappa) \qquad (1)$$

where $\alpha$ is a Seebeck coefficient of the thermoelectric material, $\sigma$ is an electric conductivity of the thermoelectric material, and $\kappa$ is a thermal conductivity of the thermoelectric material. Also, the terms $\alpha^2 \times \sigma$ are collectively referred to as an output factor Pf (the square of a Seebeck coefficient×an electric conductivity). Z has the dimension of an inverse of a temperature and becomes a dimensionless value when multiplied by the absolute temperature T. The ZT value is referred to as a dimensionless performance index, and the thermoelectric conversion efficiency increases with a thermoelectric conversion material having an increasing ZT value. As can be seen from the above formula (1), a thermoelectric material is required to have a higher Seebeck coefficient and a higher electric conductivity (a lower electric resistivity (an inverse of the electric conductivity is the electric resistivity)), i.e., a higher output factor and a lower thermal conductivity.

A part of intermetallic compounds having a MgAgAs type crystal structure exhibits semiconductor properties and is attracting attention as new thermoelectric materials. It has been reported that the thermoelectric performance of these intermetallic compounds depends on a combination of constituent elements (See, for example, Patent Literature 1).

A half Heusler compound, which is an intermetallic compound having a MgAgAs type crystal structure, is a cubic crystal system. A half Heusler compound has a structure in which, when the constituent elements thereof are represented by $M\alpha\beta$, an element a is inserted into an NaCl type crystal lattice constituted by elements M and $\beta$. A half Heusler compound having such a structure has a high Seebeck coefficient at room temperature. For example, it has been reported that ZrNiSn has a high Seebeck coefficient of $-176\ \mu V/K$ at room temperature (see, for example, Non-Patent Literature 1). However, since ZrNiSn has a high electric resistivity at a room temperature as high as 11 m$\Omega$cm and also has a high thermal conductivity as high as 8.8 W/mK, the dimensionless performance index ZT thereof is as small as 0.01.

On the other hand, a thermoelectric material containing a rare earth, e.g., HoPdSb, has been reported as having a thermal conductivity of 6 W/mK, and the thermal conductivity is somewhat smaller than ZrNiSn (see, for example, Non-Patent Literature 2). However, HoPdSb has a Seebeck coefficient of 150 $\mu$V/K at room temperature and an electric resistivity as high as 9 m$\Omega$cm at room temperature, so the dimensionless performance index ZT remains at 0.01. It is reported that even with $Ho_{0.5}Er_{0.5}PdSb_{1.05}$, $Er_{0.25}Dy_{0.75}Pd_{1.02}Sb$ and $Er_{0.25}Dy_{0.75}PdSb_{1.05}$, the dimensionless performance indices ZT at room temperature are as small as 0.04, 0.03, and 0.02, respectively.

As described above, it has been reported in many documents that the thermoelectric performance of a thermoelectric material varies depending on a combination of constituent elements. However, conventional thermoelectric materials have not yet exhibited sufficiently high thermoelectric performance, and therefore, a thermoelectric material having a MgAgAs type crystal structure, which has a relatively large output factor and a sufficiently low thermal conductivity and exhibits a high dimensionless performance index ZT, and a thermoelectric conversion element using the thermoelectric material have been developed. (e.g., Patent Literature 2 and Patent Literature 3)

However, the developed thermoelectric materials have a problem that when industrially mass-produced, variations in ZT value easily occur among a plurality of thermoelectric materials constituting a thermoelectric conversion element. That is, variations in the Seebeck coefficient, electric conductivity, thermal conductivity, etc., are likely to occur since the ZT value is related to the formula (1).

CITATION LIST

Patent Literature

Patent Literature 1: Jpn. Pat. Appln. KOKAI Publication No. 2001-189495
Patent Literature 2: Japanese Patent No. 4497981
Patent Literature 3: Japanese Patent No. 4521215

Non-Patent Literature

Non-Patent Literature 1: J. Phys.: Condens. Matter, 11, 1697-1709 (1999)
Non-Patent Literature 2: Appl. Phys. Lett., 74, 1415-1417 (1999)
Non-Patent Literature 3: Revised 3rd Edition of Metal Data Book (The Fourth printing, Apr. 10, 1997, published by Maruzen Co., Ltd., and Edited by The Japan Institute of Metals and Materials), pages 13-14
Non-Patent Literature 4: The Iron and Steel Material Handbook (Edited by The Japan Institute of Metals and Materials and The Iron and Steel Institute of Japan, published By Maruzen Co., Ltd., Jan. 20, 1985, The Second Edition, the Fifth printing, Pages 55, 946, and 947)

SUMMARY OF THE INVENTION

An object to be solved by the present invention is to provide a thermoelectric material, in which defects in a plurality of thermoelectric materials having a MgAgAs type crystal structure and constituting a thermoelectric conversion element, are reduced to reduce variations in properties (Seebeck coefficient, electric conductivity, and thermal conductivity) among the plurality of thermoelectric materials, a manufacturing method of the thermoelectric material, a thermoelectric conversion element including the thermoelectric material, and a thermoelectric conversion module including the thermoelectric conversion element.

A thermoelectric material according to an embodiment is a p-type or an n-type thermoelectric material. The thermoelectric material includes a sintered body whose composition is represented by the following composition formula. The thermoelectric material has a MgAgAs type crystal phase as a main phase. An area ratio of internal defects by ultrasonic flaw detection in the thickness direction with respect to a surface parallel with one plane of the thermoelectric material is 10% or less. There is no defect having a length of 800 μm or more in a surface of the thermoelectric material.

$$(Ti_{a1}Zr_{b1}Hf_{c1})_x\alpha_y\beta_{100-x-y}$$

where $0 < a1 \le 1$, $0 < b1 \le 1$, $0 < c1 \le 1$, $a1+b1+c1=1$, $30 \le x \le 35$, and $30 \le y \le 35$; in the n-type thermoelectric material, $\alpha$ is Ni, $\beta$ is Sn, and 30 atomic % or less of $\beta$ is substituted by at least one element selected from the group consisting of Si, Mg, As, Sb, Bi, Ge, Pb, Ga, and In; and in the p-type thermoelectric material, $\alpha$ is Co, $\beta$ is Sb, and 30 atomic % or less of $\beta$ is substituted by at least one element selected from the group consisting of Sn, Si, Mg, As, Bi, Ge, Pb, Ga, and In.

A thermoelectric material according to an embodiment of the present application includes a sintered body including a plurality of p-type and n-type thermoelectric materials constituting a thermoelectric conversion element, individually represented by a composition formula shown below, and having a MgAgAs type crystal structure as a main phase, $$(Ti_{a1}Zr_{b1}Hf_{c1})_x\alpha_y\beta_{100-x-y} \qquad (2)$$

(in the formula, $0 < a1 \le 1$, $0 < b1 \le 1$, $0 < c1 \le 1$, $a1+b1+c1=1$, $30 \le x \le 35$, and $30 \le y \le 35$; in the n-type thermoelectric materials, $\alpha$ is Ni, $\beta$ is Sn, and 30 atomic % or less of $\beta$ is substituted by at least one element selected from the group consisting of Si, Mg, As, Sb, Bi, Ge, Pb, Ga and In; and in the p-type thermoelectric materials, $\alpha$ is Co, $\beta$ is Sb, and 30 atomic % or less of $\beta$ is substituted by at least one element selected from the group consisting of Sn, Si, Mg, As, Bi, Ge, Pb, Ga, and In, in which an area ratio of internal defects of the thermoelectric materials constituting the one thermoelectric conversion element is 10% or less in terms of a total area ratio of defective portions in a scanning surface that has been subjected to ultrasonic flaw detection in a thickness direction with respect to a surface parallel with one plane of the thermoelectric material (conditions: frequency, 200 MHz; focal length, 2.9 mm; scanning pitch, 2.5 μm; scanning surface size, 2 mm×3 mm; a Cu plate (0.25 mm thick) is bonded on both sides of a sample (1 mm thick); lower limit defect length, 3 μm), and no defect having a length of 800 μm or more is present at any vertex of chips of the thermoelectric materials.

A manufacturing method of the thermoelectric material includes melting and casting an alloy, which is a raw material of the sintered body of the thermoelectric material by a high frequency vacuum melting method to produce an ingot, pulverizing the ingot to obtain powder particles, sintering the powder particles by a sintering method without using a binder to form a sintered body of crystal particles, and processing the sintered body into a predetermined shape by a machining process in which no stress equal to or higher than a yield stress of the sintered body is applied to the sintered body during the process of the sintered body.

A thermoelectric conversion element according to an embodiment of the present invention includes the p-type thermoelectric material and the n-type thermoelectric material that are connected in series, and at least one of the p-type thermoelectric material and the n-type thermoelectric material contains the thermoelectric material.

A thermoelectric conversion module according to an embodiment of the present invention includes first electrode members arranged on a low temperature side, second electrode members arranged on a high temperature side so as to face the first electrode members; and a thermoelectric conversion element disposed between the first electrode member and the second electrode member and being electrically connected to both the first and second electrode members, in which the thermoelectric conversion element includes p-type thermoelectric materials and n-type thermoelectric materials, the p-type thermoelectric materials and the n-type thermoelectric materials are alternately arranged and connected in series with the first and second electrode members, and at least one of the p-type thermoelectric materials and the n-type thermoelectric materials include at least one of the thermoelectric material described above.

BRIEF DESCRIPTION OF THE DRAWINGS

FIG. 1 is a cross-sectional view of an example of a thermoelectric conversion module according to an embodiment of the present invention.

DETAILED DESCRIPTION OF THE INVENTION

Embodiments of the present invention will be described below.

As described with reference to the above formula (1), a thermoelectric material with a higher output factor that is a product represented by the square of a Seebeck coefficient× an electric conductivity and a lower thermal conductivity exhibits excellent performance with a high dimensionless performance index ZT value. Both of a variation in the output factor that is a product represented by the square of a Seebeck coefficient×an electric conductivity and a variation in thermal conductivity could be a factor of a variation in the dimensionless performance index ZT value of the thermoelectric material. And the variation in the output factor and thermal conductivity are affected by the composition of the thermoelectric material (impurities, an area ratio of the main phase, a composition deviation, etc.), the crystal structure (average crystal grain size, internal defects, etc.), or surface properties (surface shape, surface roughness, appearance defects, etc.).

The inventors have intensively researched and studied causes of the variations and have found that when a thermoelectric material is industrially mass-produced, the influence of defects of the thermoelectric material is particularly large among the causes described above. The defects of the thermoelectric material indicate internal defective portions and appearance defective portions including vacancies, pores, voids, scratches, cracks, crevices, peeling, inclusions, foreign matter, chipping, deficient portions, foreign phases, etc., present in the thermoelectric material.

In industrial mass production, conventionally, acceptability has been judged only by appearance defects, such as scratches, cracks, crevices, peeling, chipping, deficient portions, etc., and almost no internal defects have been taken into consideration. In particular, there has been little investigation or improvement on the influence on the properties due to the presence of these internal defects. However, the inventors have conducted intensive research and studies and have found that defects inside thermoelectric materials can be detected through ultrasonic flaw detection by a tomographic photographic device, etc., such as an ultrasonic flaw detection imaging device, etc., and therefore, by reducing the internal defects described above in addition to appearance defects, it is possible not only to reduce the variation in dimensionless performance index ZT value as a property of a thermoelectric material, but also to achieve an improvement in a yield of the thermoelectric material, an improvement in a joining ratio of the thermoelectric material to electrode members, prevention of degradation in properties (dimensionless performance index ZT value) during use of the thermoelectric material, and longer life performance of a thermoelectric conversion element or thermoelectric conversion module.

As a result of further research and studies, the inventors have found that the effects can be achieved by forming a thermoelectric material according to an embodiment of the present invention into a sintered body of the thermoelectric material in which internal defects is 10% or less in terms of an area ratio of the total defective portions in a scanning surface which has been subjected to ultrasonic flaw detection in the thickness direction with respect to a surface parallel with an electrode joint surface of the thermoelectric material (conditions: frequency, 200 MHz; focal length, 2.9 mm; scanning pitch, 2.5 µm; scanning surface size, 2 mm×3 mm; a Cu plate having 0.25 mm thick is bonded on both sides of a sample having 1 mm thick; lower limit defect length, 3 µm), and no defect having a length of 800 µm or more is present at any vertex of a cube chip of the thermoelectric material. Herein, a defect with at least a part thereof extending to a vertex is regarded as a defect existing on the vertex.

When the total area of defective portions by the ultrasonic flaw detection of internal defects exceeds 10%, the variation of the dimensionless performance index ZT value as a property of the thermoelectric material becomes large, easily causing a decrease in yield, degradations of properties, and a reduction in the life performance of the thermoelectric conversion element or thermoelectric conversion module. Even if a small defect having an internal defect length of less than 3 µm is present, the degradation of properties hardly occurs. When there is a defect having a length of 800 µm or more at any vertex of the cubic chip, similar to the case described above, the variation in the dimensionless performance index ZT value as a property of the thermoelectric material becomes large, easily causing a decrease in yield, degradations of properties, and a reduction in the life performance of the thermoelectric conversion element or thermoelectric conversion module. More preferred is a sintered body having no defects of 520 µm or more in length at any vertex of the cubic chip.

The shape of the thermoelectric material is not limited to a cubic chip. The thermoelectric material can be made to have structures having various shapes, for example, a rectangular parallelepiped chip, a columnar chip, etc. Therefore, it is desirable to measure internal defects by ultrasonic flaw detection in the thickness direction of a thermoelectric material with respect to a surface parallel with the electrode joint surface of the thermoelectric material, but internal defects can be measured in the thickness direction with respect to a surface parallel with a discretional one plane of the thermoelectric material. The Cu plate is provided for preventing new defects from occurring in a measurement target in the operation performed for the measurement. In some cases, electrodes have already been joined to a thermoelectric material included in the thermoelectric conversion element. In such a case, there is no need to join the Cu plate to the thermoelectric material, and ultrasonic flaw detection under the above-mentioned conditions can be performed on a surface parallel with a discretional one plane in the thickness direction of the thermoelectric material to which the electrodes have been joined.

Furthermore, the sintered body is not limited to a sintered body having no defects of 800 µm or more in length at any vertex of the chip. Both a thermoelectric material having a shape without a vertex and a thermoelectric material having a shape with a vertex can improve the dimensionless performance index ZT value of the thermoelectric material by using a sintered body having no defects of 800 µm or more (preferably 520 µm or more) in length in the surface of the thermoelectric material. The length of a defect in the surface of the thermoelectric material is measured by the following method. The surface of the thermoelectric material is observed with a scanning electron microscope (SEM) at a magnification of 50×, and the maximum length of a defect present in the field of view is taken as the maximum length of the defect in the surface of the thermoelectric material.

The composition of the thermoelectric material is represented by a composition formula: $(Ti_{a1}Zr_{b1}Hf_{c1})\times\alpha_y\beta_{100-x-y}$ (2). The thermoelectric material can take a p-type or an n-type, or both a p-type and an n-type. The main phase of the thermoelectric material is a MgAgAs type crystal phase, and specifically, a half Heusler phase having the basic composition of a thermoelectric material. Furthermore, when phases are included in the thermoelectric material, it is desirable that the main phase be a phase having the highest existence ratio.

The thermoelectric material according to the embodiment of the present invention is manufactured as one embodiment as follows.

Constituent elements represented by the following composition formula are blended in predetermined amounts and melted and cast to form an alloy.

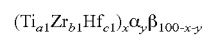

$(Ti_{a1}Zr_{b1}Hf_{c1})_x\alpha_y\beta_{100-x-y}$ (where 0<a1≤1, 0<b1≤1, 0<c1≤1, a1+b1+c1=1, 30≤x≤35, and 30≤y≤35; in the n-type thermoelectric material, α is Ni, β is Sn, and 30 atomic % or less of β is substituted by at least one element selected from the group consisting of Si, Mg, As, Sb, Bi, Ge, Pb, Ga, and In; and in the p-type thermoelectric materials, α is Co, β is Sb, and 30 atomic % or less of β is substituted by at least one element selected from the group consisting of Sn, Si, Mg, As, Bi, Ge, Pb, Ga, and In). The melting and casting are performed by a method, such as arc melting, high frequency melting, skull melting, etc. Preferably, the constituents are melted and cast by high-frequency melting in a vacuum.

In the composition formula, it is preferable that 0.2≤a1≤0.7. It is preferable that a part of Ti, Zr, and Hf in the composition formula be substituted by at least one element selected from the group consisting of V, Nb, Ta, Cr, Mo, and W. It is preferable that a part of α in the composition formula be substituted by at least one element selected from the group consisting of Mn, Fe, and Cu.

The ingot of the alloy melted and cast as described above is pulverized by a pulverization method using any of various pulverizers, such as a jaw crusher, a ball mill, a Brown mill, a stamp mill, a pin mill, etc., to obtain an alloy pulverized powder.

After the ingot of the alloy being pulverized as described above, the obtained powder is sieved using a sieve pursuant to the nominal sieve 106 of "JISZ 8801-1: 2006; Test sieves—Part 1: Test sieves of metal wire cloth" to adjust the average particle diameter of the pulverized powder to 20 μm to 100 μm. If the average particle diameter of the powder is smaller than 20 μm, it is difficult to form a uniform molded product when molding the powder because the powder is too small. If the average particle diameter of the powder exceeds 100 μm, vacancies, voids, pores, etc. tend to be formed in the molded body because the powder is too large. Therefore, the average particle diameter of the pulverized powder is preferably 20 μm to 100 μm.

After being subjected to pulverization, and sieving for size adjustment as described above, the alloy powders are sintered and molded in an integrated form. In order to prevent oxidation of the alloy, the molding into an integrated form is preferably performed in an inert atmosphere such as Ar. As a sintering method, there are a hot pressing method, a hot isostatic pressing (HIP) method, a spark plasma sintering (SPS) method, a sintering method using millimeter wave heating, etc.

In the sintering using the hot pressing method, it is preferable that a sintered body of the thermoelectric material be produced through sintering by a hot press method in which the sintered body of the thermoelectric material is held at a pressurizing force of 35 MPa or more and at a temperature of 1200° C. or more for 1 hour or more and 10 hours or less. When the pressure is less than 35 MPa, the temperature is less than 1200° C., and the sintering time is less than 1 hour, the relative density of the sintered body becomes less than 95%, easily causing cracking and cracks of the sintered body, and excellent thermoelectric properties cannot be obtained.

In the sintering using the hot isostatic pressing. (HIP) method, it is preferable that the thermoelectric material be sintered under conditions where the thermoelectric material is held at a pressuring force of 98 MPa or more, and at a temperature of 1200° C. or more for 1 hour or more and 10 hours or less. Furthermore, it is preferable that a difference between a coefficient of linear thermal expansion (0 to 700° C.) of an encapsulant used at the time of the sintering and a coefficient of linear thermal expansion (0 to 700° C.) of the thermoelectric material be in the range of $\pm 5 \times 10^{-6}/°$ C. If the difference in coefficient of linear thermal expansions (0 to 700° C.) is larger than $+5 \times 10^{-6}/°$ C. or smaller than $-5 \times 10^{-6}/°$ C., this easily causes cracking and cracks of the sintered body, and excellent thermoelectric properties cannot be obtained. A more preferred range of the difference in coefficient of linear thermal expansion (0 to 700° C.) is in the range of $\pm 3 \times 10^{-6}/°$ C. The material of the encapsulant includes preferably Mo, Ta, Nb, Ti, etc.

As the above-mentioned thermoelectric materials, the coefficient of linear thermal expansion, for example, of a P-type thermoelectric material is about $9.4 \times 10^{-6}/°$ C., the coefficient of linear thermal expansion of an N-type thermoelectric material is about $9.4 \times 10^{-6}/°$ C., and among preferred materials for the encapsulant, for example, Mo has a coefficient of linear thermal expansion of about $5.8 \times 10^{-6}/°$ C. (20 to 500° C.: $5.7 \times 10^{-6} K^{-1}$, 20 to 1000° C.: $5.75 \times 10^{-6} K^{-1}$, Non-Patent Literature 3, page 14, Table 1.2.7), Ta has a coefficient of linear thermal expansion of about $6.6 \times 10^{-6}/°$ C. (20 to 100° C.: $6.5 \times 10^{-6} K^{-1}$, 20 to 500° C.: $6.6 \times 10^{-6} K^{-1}$, Non-Patent Literature 3, page 14, Table 1.2.7), Nb has a coefficient of linear thermal expansion of about $7.2 \times 10^{-6}/°$ C. (0 to 100° C., Non-Patent Literature 3, page 13, Table 1.2.6), and Ti has a coefficient of linear thermal expansion of about $9.9 \times 10^{-6}/°$ C. (20 to 600° C.: $9.7 \times 10^{-6} K^{-1}$, 20 to 800° C.: $9.9 \times 10^{-6} K^{-1}$, Non-Patent Literature 3, page 14, Table 1.2.7). An STPG material as a conventional encapsulant has a coefficient of linear thermal expansion of about $15.0 \times 10^{-6}/°$ C., which is larger than the coefficient of linear thermal expansion of the thermoelectric material, easily causes cracking and cracks of the sintered body, and excellent thermoelectric properties cannot be obtained.

In particular, sintering using the SPS method is desirable. This is because in the SPS method, a portion that is brought into direct contact with the powder is self-heated and is sintered under application of pressure, and therefore a uniform and dense sintered body having a fine crystal grain size can be obtained in a short time. In the SPS method, as described above, the inside of the pulverized powder is self-heated to generate heat while being pressurized and is then sintered, so it is possible to sinter the thermoelectric material at not so high of a temperature in a short time, resulting in a crystal structure in a state where the crystal grain size remains minute. Since the crystal structure is uniform, the uniformity of the electrical resistance and thermal resistance affected by the crystal structure is also improved, and variations in the electrical resistance and the thermal resistance can be respectively reduced. In addition, since the crystal structure is uniform and of fine crystal grains, the strength of grain boundaries is improved. Since particles of the original pulverized powder generate heat by self-heating at respective contact points and are pressure-sintered, the adhesion strength between the pulverized powder particles is also improved. Therefore, even if a sudden strain relaxing force is generated inside the sintered body in the sintering process, internal defects are less likely to occur, and internal defects are less likely to occur even in machining in the subsequent process. Thus, it is possible to suppress variations of the properties due to a local reduction in electric conductivity caused by internal defects and a reduction in lifetime accompanied by the progress of the defects due to a change in use over time. Furthermore, in the SPS method, sintering with a near net shape is possible, and machining process such as cutting after sintering can be greatly omitted. By manufacturing it with a near net shape, it is possible to suppress variations in composition and density of individual chips of thermoelectric materials. Therefore, it is possible to suppress variations in thermoelectric properties (electric conductivity, Seebeck coefficient, etc.) caused by the variations.

The produced alloy may be subjected to heat treatment if necessary. By this heat treatment, the alloy is made into a single phase and the average crystal grain size is also controlled, so that the thermoelectric properties (electric conductivity, Seebeck coefficient, etc.) can be further improved. From the viewpoint of preventing oxidation of the alloy, it is preferable that the process such as heat treatment be performed in an inert atmosphere such as Ar.

The thermoelectric material manufactured as described above is processed into a chip shape having predetermined shape dimensions by machining processes including cutting with a wire saw, a dicer, etc. In the machining process, it is desirable to process the sintered body by a machining process in which no stress equal to or higher than the yield stress of the sintered body is applied to the sintered body. Therefore, as a cutting blade that is difficult to cause defects, such as cracking, cracks, chipping, peeling, etc. of a blade of a dicer for processing the sintered body into a predetermined chip shape, by making the thickness of the blade thinner or by making the material of the blade bonding agent into a material with high rigidity such as made of a superalloy or cermet, or by generating ultrasonic vibrations while the dicer is driven and is cutting the sintered body, it is possible to suppress the occurrence of the defects due to machining. In particular, it is preferable to perform the cutting process using a cutting blade having a blade thickness of 0.5 mm or less. More preferred is a cutting blade of 0.3 mm or less in thickness. If the thickness of the blade exceeds 0.5 mm, a stress equal to or higher than the yield stress of the sintered body is liable to be applied to the sintered body at the time of the cutting process, and the above-mentioned defects are likely to occur. Furthermore, by generating ultrasonic vibrations and cutting the sintered body when the dicer is driven, clogging due to shavings in the processing is reduced, and the flowability of a lubricating cooling liquid is improved. Therefore, a stress equal to or higher than the yield stress of the thermoelectric material of the sintered body as the polycrystalline body is hardly applied to the sintered body during the cutting process, and the stress load at the time of processing can be reduced. Furthermore, by optimizing the conditions such as the number of revolutions and feed speed of a cutting blade during the cutting process by the dicer, the occurrence of defects can be suppressed, and cutting bending of a cutting portion and variations in the groove width of the cutting portion can be drastically reduced.

Also, as the chip size, the chip is preferably a cube or rectangular parallelepiped having a length of 2 to 10 mm, a width of 2 to 10 mm, and a height of 2 to 20 mm. In the case of a column shape, a chip having a diameter of 2 to 10 mm and a height of 2 to 20 mm is preferable. The chip size is not particularly limited, but if it is the above-mentioned size, the effect of reducing internal defects is easily obtained. Also, if the size is too small, the thermoelectric conversion effect becomes relatively small. When the size is increased, the stress at the time of cutting process tends to be applied to the sintered body.

After processing the thermoelectric material, it is preferable to perform plating such as Ni for the purpose of corrosion resistance. Instead of Ni plating, gold (Au) plating, copper (Cu) plating, etc., may be applied. The thickness of the plating layer can be in the range of 4 μm or more and 8 μm or less.

A thermoelectric conversion element according to an embodiment of the present invention can be manufactured using the thermoelectric material obtained by using the method described above. In this case, the thermoelectric conversion element can be manufactured by using either one or both of the n-type and the p-type of thermoelectric materials according to the embodiment of the present invention. In the case where the thermoelectric material according to the embodiment of the present invention is used only for either n-type or p-type, the other is made of a material such as a Bi—Te based, a Pb—Te based, etc.

FIG. 1 is a cross-sectional view of an example of a thermoelectric conversion element according to an embodiment of the present invention. The thermoelectric conversion element has a structure in which a plurality of p-type thermoelectric materials 1 and a plurality of n-type thermoelectric materials 2 are alternately arranged and are connected in series by an electrode 3a on a lower insulating substrate 4a and an electrode 3b on an upper insulating substrate 4b.

EXAMPLES

Hereinafter, Examples of the present invention and Comparative Examples will be described.

Examples 1 to 4 and Comparative Examples 1 and 2

As Examples of the present invention, Table 1 shows the basic compositions of N-type and P-type of Examples and Comparative Examples, respectively. As raw materials, Ti with 99.9% purity, Zr with 99.9% purity, Hf with 99.9% purity, Ni with 99.99% purity, and Sn with 99.99% purity, and other materials also having a purity of 99.9% or more were prepared, and each of the raw materials was weighed so as to respectively obtain alloys each having an N-type basic composition or a P-type basic composition for the Examples and Comparative Examples shown in Table 1.

[Table 1]

TABLE 1

| | Basic Composition |
|---|---|
| Example 1 (N-type) | $(Ti_{0.3}Zr_{0.35}Hf_{0.35})Ni(Sn_{0.994}Sb_{0.006})$ |
| Examples 2, 3, and 4 (P-type) | $(Ti_{0.3}Zr_{0.35}Hf_{0.35})Co(Sn_{0.15}Sb_{0.85})$ |
| Comparative Example 1 (N-type) | $(Ti_{0.3}Zr_{0.35}Hf_{0.35})Ni(Sn_{0.994}Sb_{0.006})$ |
| Comparative Example 2 (P-type) | $(Ti_{0.3}Zr_{0.35}Hf_{0.35})Co(Sn_{0.15}Sb_{0.85})$ |

The weighed raw materials were mixed, and Examples 1, 2, 3, and 4 and Comparative Examples 1 and 2 were respectively placed in a high-frequency vacuum melting furnace, and the inside of the furnace was evacuated to a degree of vacuum of $2 \times 10^{-3}$ Pa. Thereafter, high-purity Ar having a purity of 99.999% was introduced into the furnace up to 0.04 MPa to obtain a reduced Ar atmosphere, and each of the Examples and Comparative Examples was subjected to high-frequency melting in the reduced pressure Ar atmosphere, followed by casting to produce an ingot. The same melting was carried out in each of three lots in all cases of Examples 1, 2, 3, and 4 and Comparative Examples 1 and 2 to produce ingots. The compositions of these ingots were analyzed by ICP emission spectroscopy for each melting lot, and each of the compositions was found to have almost the predetermined basic composition.

Each of the ingots of Examples 1, 2, 3, and 4 and Comparative Examples 1 and 2 was heat-treated at 1100° C. for 2 hours in a high vacuum of $10^{-4}$ Pa or less. Furthermore, these ingots were pulverized to a powder having a grain size of 100 μm or less by using a pulverizer such as a pin mill and sieved with a sieve having an opening of 106 μm. The resulting alloy powder was provisionally molded at a pressure of 50 MPa using a die having an inner diameter φ of 250 mm for each of lots of Examples 1, 2, 3, and 4 and Comparative Examples 1 and 2. In each of the lots of Examples 1, 2, 3, and 4, a carbon mold having an inner diameter φ of 250 mm was filled with the obtained provisionally molded body, and the provisionally molded body was sintered by applying a large current ON/OFF DC pulse current thereto and discharging electricity (Spark plasma sintering method (SPS method), highest temperature 1250°

C.×20 minutes)) while being pressurized (50 MPa) within a vacuum of $10^{-4}$ Pa or less to thereby obtain a column shaped sintered body having a diameter $\phi$ of 250 mm×t 20 mm. In each of the lots of Comparative Examples 1 and 2, the provisionally molded body was pressurized (40 MPa) and sintered by a hot press method, in which a carbon mold was filled with the obtained provisionally molded body in a reduced pressure Ar atmosphere, at 1150° C. for 3 hours to thereby obtain a columnar sintered body having a diameter of 250 mm×t 20 mm as in the Examples.

These sintered bodies were examined by the powder X-ray diffraction method and found to have a MgAgAs type crystal phase as a main crystal phase.

From the sintered bodies of Examples 1 and 2, a plurality of chip-shaped thermoelectric materials each having a size of 4 mm×4 mm×2.5 mm, 4 mm×4 mm×5 mm, or 4 mm×4 mm×16 mm were prepared by cutting and processing with a dicer using a blade having a blade thickness of 0.3 mm. From the sintered body of Example 3, a plurality of chip-shaped thermoelectric materials each having a size of 4 mm×4 mm×2.5 mm, 4 mm×4 mm×5 mm, or 4 mm×4 mm×16 mm were prepared by cutting and processing with a dicer using a blade having a blade thickness of 0.3 mm. From the sintered body of Example 4, a plurality of chip-shaped thermoelectric materials each having a size of 4 mm×4 mm×2.5 mm, 4 mm×4 mm×5 mm, or 4 mm×4 mm×16 mm were prepared by cutting and processing with a dicer using a blade having a blade thickness of 0.5 mm. From the sintered bodies of Comparative Examples 1 and 2, a plurality of chip-shaped thermoelectric materials each having a size of 4 mm×4 mm×2.5 mm, 4 mm×4 mm×5 mm, or 4 mm×4 mm×16 mm were prepared by cutting and processing with a dicer using a blade having a blade thickness of 0.7 mm. Each of the chip sizes is indicated by length×width×thickness.

The dimensions of each of the plurality of chip-shaped thermoelectric materials of Examples and Comparative examples were measured by using a micrometer to determine a volume of each of the plurality of chip-shaped thermoelectric materials, and furthermore, a weight of each of the plurality of thermoelectric material chips was measured. A density of each of the plurality of chip-shaped thermoelectric materials was examined from the volume, and a relative density was determined from the density and a true density determined from the weight and volume of the melt alloy. Table 2 shows an average value, a maximum value, a minimum value, and a standard deviation of the relative density of each of the plurality of chip-shaped thermoelectric materials cut out from the sintered bodies of Examples and Comparative Examples. Table 2 further shows an area ratio of internal defects of each of the thermoelectric materials of Examples and Comparative Examples, and defect lengths of appearance defects of the thermoelectric material. Internal defects of the thermoelectric material were measured as a total area ratio of defective portions in a scanning surface which had been subjected to ultrasonic flow detection in the thickness direction with respect to a plane parallel with an electrode joint surface of the thermoelectric material (conditions: frequency, 200 MHz; focal length, 2.9 mm; scanning pitch, 2.5 µm; scanning surface size, 2 mm×3 mm; a Cu plate (0.25 mm thick) was bonded on both sides of a sample (1 mm thick); lower limit defect length, 3 µm). Specifically, for image data at five discretionary locations, an area ratio is calculated for each image data, and the average of the obtained values is shown in Table 2 as an internal defect area ratio (%). Appearance defects were measured for the maximum length of defects present at each vertex of the cube chip (4 mm×4 mm×2.5 mm size) of the thermoelectric material.

TABLE 2

| | Relative Density (%) | | | | Internal defect-area ratio (%) detected by ultrasonic flaw detector | Maximum length (µm) of appearance defect in vertex |
|---|---|---|---|---|---|---|
| | Minimum value | Maximum value | Average value | Standard deviation | | |
| Example 1 | 98.0 | 101.0 | 99.0 | 0.5 | 3.1 | 118 |
| Example 2 | 99.0 | 101.0 | 99.3 | 0.4 | 4.8 | 265 |
| Example 3 | 99.0 | 101.0 | 99.3 | 0.4 | 2.9 | 47 |
| Example 4 | 99.0 | 101.0 | 99.3 | 0.4 | 8.2 | 412 |
| Comparative Example 1 | 97.4 | 100.9 | 99.1 | 1.0 | 11.0 | 812 |
| Comparative Example 2 | 97.4 | 100.9 | 99.1 | 1.0 | 12.2 | 902 |

Nickel plating was applied to the plurality of the chip-shaped thermoelectric materials of Examples and Comparative Examples.

The thermoelectric properties of the obtained chip-shaped thermoelectric materials were evaluated by the following method.

(A) Resistivity

Electrodes were formed on each of the chip-shaped thermoelectric materials of 4 mm×4 mm×16 mm in size, and the resistivity thereof was measured by a direct current four terminal method.

(B) Seebeck Coefficient

A temperature difference of 2° C. was provided to both ends of each of the chip-shaped thermoelectric material of 4 mm×4 mm×5 mm in size, and an electromotive force thereof was measured to determine a Seebeck coefficient.

(C) Thermal Conductivity

For each chip shape of $\phi$ 10 mm×T 2 mm, the thermal diffusivity was measured by the laser flash method. Separately from the above, specific heat was determined by a DSC (Differential Scanning calorimeter) measurement. The density of each of the chip-shaped thermoelectric materials obtained above was used. From these values, thermal conductivity (lattice thermal conductivity) was calculated.

Using the thus obtained values of resistivity, Seebeck coefficient, and thermal conductivity, a dimensionless performance index ZT was determined based on the formula (1) described above. Table 3 shows a maximum value, a minimum value, an average value, and a standard deviation of the dimensionless performance index ZT of each of Examples and Comparative Examples at 300 K and 673 K.

TABLE 3

| | Dimensionless Performance Index ZT Measurement temperature (K) | | | | | | | |
|---|---|---|---|---|---|---|---|---|
| | 300 K | | | | 673 K | | | |
| | Minimum value | Maximum value | Average value | Standard deviation | Minimum value | Maximum value | Average value | Standard deviation |
| Example 1 | 0.16 | 0.23 | 0.19 | 0.02 | 0.55 | 0.73 | 0.61 | 0.06 |
| Example 2 | 0.14 | 0.17 | 0.15 | 0.01 | 0.43 | 0.48 | 0.45 | 0.01 |
| Example 3 | 0.15 | 0.18 | 0.16 | 0.02 | 0.43 | 0.49 | 0.46 | 0.01 |
| Example 4 | 0.13 | 0.16 | 0.14 | 0.01 | 0.42 | 0.47 | 0.45 | 0.01 |

TABLE 3-continued

| | Dimensionless Performance Index ZT Measurement temperature (K) | | | | | | | |
|---|---|---|---|---|---|---|---|---|
| | 300 K | | | | 673 K | | | |
| | Minimum value | Maximum value | Average value | Standard deviation | Minimum value | Maximum value | Average value | Standard deviation |
| Comparative Example 1 | 0.07 | 0.27 | 0.20 | 0.05 | 0.46 | 0.71 | 0.61 | 0.08 |
| Comparative Example 2 | 0.02 | 0.17 | 0.08 | 0.04 | 0.19 | 0.47 | 0.32 | 0.10 |

As can be seen from the comparison between Examples and Comparative Examples for each of N-type (Example 1 and Comparative Example 1) and P-type (Examples 2, 3, 4, and Comparative Example 2), in the Examples according to the present invention, thermoelectric materials having a small standard deviation of the dimensionless performance index ZT, i.e., a plurality of uniform thermoelectric materials having small variations, were obtained at any measurement temperature by forming thermoelectric materials of a plurality of thermoelectric conversion elements constituting a thermoelectric conversion module into a sintered body having a relative density of 98% or more with a small variation in the relative density and with the standard deviation of the relative density being 0.8 or less and having less defects such as internal defects and appearance defects.

Examples 5 to 8 and Comparative Examples 3 to 7

Table 4 shows the basic compositions of N-type and P-type of the Examples and Comparative Examples, respectively. In Table 4, Examples 1 to 4 and Comparative Examples 1 and 2 are described together.

As raw materials, Ti with 99.9% purity, Zr with 99.9% purity, Hf with 99.9% purity, Ni with 99.99% purity, Sn with 99.99% purity, and other materials also having a purity of 99.9% or more were prepared, and the respective raw materials were weighed so as to obtain alloys each having an N-type basic composition and a P-type basic composition for Examples and Comparative Examples respectively shown in Table 4.

TABLE 4

| | Basic Composition |
|---|---|
| Examples 1, 5, and 7 (N-type) | $(Ti_{0.3}Zr_{0.35}Hf_{0.35})Ni(Sn_{0.994}Sb_{0.006})$ |
| Examples 2, 3, 4, 6, and 8 Comparative Examples 5, 6, and 7 (P-type) | $(Ti_{0.3}Zr_{0.35}Hf_{0.35})Co(Sn_{0.15}Sb_{0.85})$ |
| Comparative Examples 1 and 3 (N-type) | $(Ti_{0.3}Zr_{0.35}Hf_{0.35})Ni(Sn_{0.994}Sb_{0.006})$ |
| Comparative Examples 2 and 4 (P-type) | $(Ti_{0.3}Zr_{0.35}Hf_{0.35})Co(Sn_{0.15}Sb_{0.85})$ |

The weighed raw materials were mixed, and Examples 5-8 and Comparative Examples 3-7 were respectively placed in a high-frequency vacuum melting furnace, and the inside of the furnace was evacuated to a degree of vacuum of $2\times10^{-3}$ Pa. High-purity Ar having a purity of 99.999% was introduced into the furnace up to 0.04 MPa to obtain a reduced Ar atmosphere, and each of the Examples and Comparative Examples was subjected to high-frequency melting in the reduced pressure Ar atmosphere, followed by casting to produce an ingot. The same melting was carried out in each of three lots in Examples 5-8 and Comparative Examples 3-7 to produce ingots. The compositions of these ingots were analyzed by ICP emission spectroscopy for each melting lot, and each of the compositions was found to have almost the predetermined basic composition.

Each of the ingots of Examples 5 to 8 and Comparative Examples 3 to 7 was heat-treated at 1100° C. for 2 hours in a high vacuum of $10^{-4}$ Pa or less. Furthermore, these ingots were pulverized to a powder having a grain size of 100 μm or less by using a pulverizer such as a pin mill and sieved with a sieve having an opening of 106 μm. The resulting alloy powder was provisionally molded at a pressure of 50 MPa using a die having an inner diameter φ of 250 mm for each of lots of Examples 5 to 8 and Comparative Examples 3 to 7.

In each of the lots of Examples 5 and 6, the provisionally molded body was pressurized (40 MPa) and sintered at 1250° C. for 3 hours by a hot press method, in which the carbon mold was filled with the obtained provisionally molded body in a reduced pressure Ar atmosphere, to thereby obtain a columnar sintered body having a diameter φ of 250 mm×t 20 mm in the same manner.

In each of the lots of Comparative Examples 3 and 4, using an STPG encapsulant, the provisionally molded body was pressurized (117 MPa) and sintered at 1200° C. for 3 hours by the HIP method to thereby obtain a columnar sintered body having a diameter φ of 250 mm×t 20 mm in the same manner.

In each of the lots of Examples 7 and 8, using a Ta encapsulant, the provisionally molded body was pressurized (117 MPa) and sintered at 1200° C. for 3 hours by the HIP method to obtain a columnar sintered body having a diameter φ of 250 mm×t 20 mm in the same manner.

In each lot of Comparative Example 5, columnar sintered bodies were obtained in the same manner as in Examples 1 to 4. In each lot of Comparative Example 6, columnar sintered bodies were obtained in the same manner as in Examples 5 and 6. In each lot of Comparative Example 7, columnar sintered bodies were obtained in the same manner as in Examples 7 and 8.

Table 5 collectively shows sintering methods of Examples and Comparative Examples, conditions thereof, an encapsulant used in HIP, a coefficient of linear thermal expansions ($\times10^{-6}/°$ C., 0° C. to 700° C.) of thermoelectric materials, and the difference in coefficients of linear thermal expansion ($\times10^{-6}/°$ C., 0° C. to 700° C.) between a thermoelectric material and an encapsulant, the temperature, pressure, and time employed in sintering process, and the thickness of a blade used in cutting process. In Table 5, Examples 1 to 4 and Comparative Examples 1 and 2 are described together. With respect to the coefficient of linear thermal expansion of Ta in Table 5, the values at 20 to 500° C. in Tables 1.2.7 on page 14 of Non-Patent Literature 3 are used. As an STPG, STPG 35 (one kind of carbon steel tubes for pressure service JIS G 3454-1965) described in Non-Patent Literature 4, page 946, Table 25·14, Material and Specifications of carbon steel tubes (for piping and for heat transfer), was used. As a coefficient of linear thermal expansion of the STPG, a value of the average coefficient of linear thermal expansion (20 to 700° C.) of carbon steel containing 0.06% of C, 0.38% of Mn and 0.01% of Si as chemical components was used (Non-Patent Literature 4, page 55, Table 2.1).

The measuring method of the coefficient of linear thermal expansion of each of the thermoelectric materials is as follows. The coefficient of linear thermal expansion was measured based on a method of measuring an amount of linear thermal expansion of a sample from the difference in the amount of linear thermal expansion when a standard sample and a measurement sample were heated at a constant rate. As the standard sample, quartz glass or alumina was used.

and a relative density was determined from the density and a true density determined from the weight and volume of the melt alloy. Table 6 shows an average value, a maximum value, a minimum value, and a standard deviation of the relative density of each of the plurality of chip-shaped thermoelectric materials cut out from the sintered bodies of

TABLE 5

| | Coefficient of linear thermal expansion ($\times 10^{-6}/°$ C., 0° C. to 700° C.) | Difference in coefficient of linear thermal expansion between encapsulate and thermoelectric material ($\times 10^{-6}/°$ C., 0° C. to 700° C.) | Sintering method | Temperature (° C.) | Pressure (MPa) | Time (min) | Encapsulant | Blade thickness in cutting by dicer (mm) |
|---|---|---|---|---|---|---|---|---|
| Example 1 | 9.37 | — | SPS method | 1250 | 50 | 20 | — | 0.3 |
| Example 2 | 9.36 | — | SPS method | 1250 | 50 | 20 | — | 0.3 |
| Example 3 | 9.36 | — | SPS method | 1250 | 50 | 20 | — | 0.3 |
| Example 4 | 9.37 | — | SPS method | 1250 | 50 | 20 | — | 0.5 |
| Example 5 | 9.38 | — | Hot pressing method | 1250 | 40 | 180 | — | 0.5 |
| Example 6 | 9.37 | — | Hot pressing method | 1250 | 40 | 180 | — | 0.5 |
| Example 7 | 9.37 | 2.77 | HIP method | 1200 | 117 | 180 | Ta | 0.5 |
| Example 8 | 9.36 | 2.76 | HIP method | 1200 | 117 | 180 | Ta | 0.5 |
| Ta | 6.6 | — | — | — | — | — | — | — |
| STPG | 15.0 | — | — | — | — | — | — | — |
| Comparative Example 1 | 9.38 | — | Hot pressing method | 1150 | 40 | 180 | — | 0.7 |
| Comparative Example 2 | 9.36 | — | Hot pressing method | 1150 | 40 | 180 | — | 0.7 |
| Comparative Example 3 | 9.38 | −5.62 | HIP method | 1200 | 117 | 180 | STPG | 0.7 |
| Comparative Example 4 | 9.37 | −5.63 | HIP method | 1200 | 117 | 180 | STPG | 0.7 |
| Comparative Example 5 | 9.36 | — | SPS method | 1250 | 50 | 20 | — | 0.7 |
| Comparative Example 6 | 9.36 | — | Hot pressing method | 1250 | 40 | 180 | — | 0.7 |
| Comparative Example 7 | 9.37 | 2.77 | HIP method | 1200 | 117 | 180 | Ta | 0.7 |
| Ta | 6.6 | — | — | — | — | — | — | — |
| STPG | 15.0 | — | — | — | — | — | — | — |

These sintered bodies were examined by the powder X-ray diffraction method and found to have a MgAgAs type crystal phase as a main crystal phrase.

From the sintered bodies of Examples 5, 6, 7, and 8, a plurality of chip-shaped thermoelectric materials each having a size of 4 mm×4 mm×2.5 mm, 4 mm×4 mm×5 mm, or 4 mm×4 mm×16 mm were prepared by cutting and processing with a dicer using a blade having a blade thickness of 0.5 mm.

From the sintered bodies of Comparative Examples 3-7, a plurality of chip-shaped thermoelectric materials each having a size of 4 mm×4 mm×2.5 mm, 4 mm×4 mm×5 mm, or 4 mm×4 mm×16 mm were prepared by cutting and processing with a dicer using a blade having a blade thickness of 0.7 mm.

The dimensions of each of the plurality of chip-shaped thermoelectric materials of Examples and Comparative examples were measured by using a micrometer to determine a volume of each of the plurality of chip-shaped thermoelectric materials, and furthermore, a weight of each of the plurality of thermoelectric material chips was measured. A density of each of the plurality of chip-shaped thermoelectric materials was examined from the volume, Examples and Comparative Examples. Table 6 further shows an area ratio of internal defects of each of the thermoelectric materials of Examples and Comparative Examples, and a defect length of appearance defects of the thermoelectric material. Examples 1-4 and Comparative Examples 1 and 2 are described together in Table 6.

Internal defects of the thermoelectric material were measured as a total area ratio of defective portions in a scanning surface which had been subjected to ultrasonic flow detection in the thickness direction with respect to a plane parallel with an electrode joint surface of the thermoelectric material (conditions: frequency, 200 MHz; focal length, 2.9 mm; scanning pitch, 2.5 μm; scanning surface size, 2 mm×3 mm; a Cu plate (0.25 mm thick) was bonded on both sides of a sample (1 mm thick); lower limit defect length, 3 μm). Specifically, for image data at five discretionary locations, an area ratio is calculated for each image data, and the average of the obtained values is shown in Table 6 as an internal defect area ratio (%). Appearance defects were measured for the maximum length of defects present at each vertex of the cube chip (4 mm×4 mm×2.5 mm size) of the thermoelectric material.

TABLE 6

| | Relative Density (%) | | | | Internal defect-area ratio (%) detected by ultrasonic flaw detector | Maximum length (μm) of appearance defect in vertex |
|---|---|---|---|---|---|---|
| | Minimum value | Maximum value | Average value | Standard deviation | | |
| Example 1 | 98.0 | 101.0 | 99.0 | 0.5 | 3.1 | 118 |
| Example 2 | 99.0 | 101.0 | 99.3 | 0.4 | 4.8 | 265 |
| Example 3 | 99.0 | 101.0 | 99.3 | 0.4 | 2.9 | 47 |
| Example 4 | 99.0 | 101.0 | 99.3 | 0.4 | 8.2 | 412 |
| Example 5 | 99.3 | 100.9 | 99.6 | 0.3 | 4.2 | 203 |
| Example 6 | 99.3 | 100.9 | 99.6 | 0.2 | 5.3 | 126 |
| Example 7 | 98.9 | 100.9 | 99.6 | 0.2 | 3.9 | 97 |
| Example 8 | 99.0 | 101.0 | 99.6 | 0.3 | 4.8 | 105 |
| Comparative Example 1 | 97.4 | 100.9 | 99.1 | 1.0 | 11.0 | 812 |
| Comparative Example 2 | 97.4 | 100.9 | 99.1 | 1.0 | 12.2 | 902 |
| Comparative Example 3 | 99.1 | 101.0 | 99.6 | 0.3 | 25.3 | 945 |
| Comparative Example 4 | 99.1 | 100.9 | 99.6 | 0.3 | 20.7 | 895 |
| Comparative Example 5 | 99.0 | 101.0 | 99.3 | 0.4 | 12.5 | 845 |
| Comparative Example 6 | 99.3 | 100.9 | 99.6 | 0.2 | 13.0 | 862 |
| Comparative Example 7 | 99.0 | 101.0 | 99.6 | 0.3 | 12.4 | 874 |

Nickel plating was applied to the plurality of chip-shaped thermoelectric materials of the Examples and Comparative Examples.

The thermoelectric properties of the obtained chip-shaped thermoelectric materials were evaluated by the following method.

(A) Resistivity

Electrodes were formed on each of the chip-shaped thermoelectric materials of 4 mm×4 mm×16 mm in size, and the resistivity thereof was measured by a direct current four terminal method.

(B) Seebeck Coefficient

A temperature difference of 2° C. was provided to both ends of each of the chip-shaped thermoelectric material of 4 mm×4 mm×5 mm in size, and an electromotive force was measured to determine a Seebeck coefficient.

(C) Thermal Conductivity

For each chip shape of ϕ 10 mm×T 2 mm, the thermal diffusivity was measured by the laser flash method. Separately from the above, specific heat was determined by a DSC (Differential Scanning calorimeter) measurement. The density of each of the chip-shaped thermoelectric materials obtained above was used. From these values, thermal conductivity (lattice thermal conductivity) was calculated.

Using the thus obtained values of resistivity, Seebeck coefficient, and thermal conductivity, a dimensionless performance index ZT was determined based on the formula (1) described above. Table 7 shows a maximum value, a minimum value, an average value, and a standard deviation of the dimensionless performance index ZT of each of Examples and Comparative Examples at 300 K and 673 K. The results of Examples 1-4 and Comparative Examples 1 and 2 are described together in Table 7.

TABLE 7

| | Dimensionless Performance Index ZT Measurement temperature (K) | | | | | | | |
|---|---|---|---|---|---|---|---|---|
| | 300 K | | | | 673 K | | | |
| | Minimum value | Maximum value | Average value | Standard deviation | Minimum value | Maximum value | Average value | Standard deviation |
| Example 1 | 0.16 | 0.23 | 0.19 | 0.02 | 0.55 | 0.73 | 0.61 | 0.06 |
| Example 2 | 0.14 | 0.17 | 0.15 | 0.01 | 0.43 | 0.48 | 0.45 | 0.01 |
| Example 3 | 0.15 | 0.18 | 0.16 | 0.02 | 0.43 | 0.49 | 0.46 | 0.01 |
| Example 4 | 0.13 | 0.16 | 0.14 | 0.01 | 0.42 | 0.47 | 0.45 | 0.01 |
| Example 5 | 0.18 | 0.24 | 0.21 | 0.02 | 0.72 | 0.79 | 0.76 | 0.03 |
| Example 6 | 0.10 | 0.14 | 0.11 | 0.01 | 0.50 | 0.57 | 0.53 | 0.02 |
| Example 7 | 0.23 | 0.28 | 0.26 | 0.02 | 0.75 | 0.82 | 0.79 | 0.02 |
| Example 8 | 0.11 | 0.15 | 0.12 | 0.02 | 0.45 | 0.53 | 0.48 | 0.03 |
| Comparative Example 1 | 0.07 | 0.27 | 0.20 | 0.05 | 0.46 | 0.71 | 0.61 | 0.08 |
| Comparative Example 2 | 0.02 | 0.17 | 0.08 | 0.04 | 0.19 | 0.47 | 0.32 | 0.10 |
| Comparative Example 3 | 0.04 | 0.27 | 0.21 | 0.09 | 0.59 | 0.79 | 0.69 | 0.09 |
| Comparative Example 4 | 0.04 | 0.21 | 0.16 | 0.06 | 0.17 | 0.65 | 0.51 | 0.17 |
| Comparative Example 5 | 0.03 | 0.18 | 0.13 | 0.04 | 0.22 | 0.57 | 0.46 | 0.07 |

TABLE 7-continued

| | Dimensionless Performance Index ZT Measurement temperature (K) | | | | | | | |
|---|---|---|---|---|---|---|---|---|
| | 300 K | | | | 673 K | | | |
| | Minimum value | Maximum value | Average value | Standard deviation | Minimum value | Maximum value | Average value | Standard deviation |
| Comparative Example 6 | 0.05 | 0.16 | 0.10 | 0.04 | 0.31 | 0.58 | 0.50 | 0.09 |
| Comparative Example 7 | 0.04 | 0.15 | 0.11 | 0.04 | 0.25 | 0.52 | 0.45 | 0.09 |

As can be seen from the comparison between Examples and Comparative Examples for each of the N-type (Examples 1 and 5, and Comparative Example 1) and P-type (Examples 2, 3, 4, and 6, and Comparative Example 2), in the Examples according to the present invention, thermoelectric materials having a small standard deviation of the dimensionless performance index ZT, i.e., a plurality of uniform thermoelectric materials having small variations, were obtained at any measurement temperature by forming thermoelectric materials of a plurality of thermoelectric conversion elements constituting a thermoelectric conversion module into a sintered body having a relative density of 98% or more, with a small variation in the relative density and with the standard deviation of the relative density being 0.8 or less, and having less defects such as internal defects and appearance defects than in Comparative Examples by optimizing the conditions of the SPS method and the hot press method as the sintering method.

As can be seen from the comparison between Examples and Comparative Examples for each of the N-type (Examples 7 and Comparative Example 3) and P-type (Example 8, and Comparative Example 4), in the Examples according to the present invention, when formed into a sintered body by the HIP method, and in the case where a material as an encapsulant (Ta in the Examples) having a coefficient of linear thermal expansion close to the coefficient of linear thermal expansion (0-700° C.) of thermoelectric materials was used, thermoelectric materials having a small standard deviation of the dimensionless performance index ZT, i.e., a plurality of uniform thermoelectric materials having small variations, were obtained at any measurement temperature by making the thermoelectric materials have less defects such as internal defects and appearance defects than in Comparative Examples, as compared with the case where the STPG as a conventional encapsulant (having a large coefficient of linear thermal expansion than those of thermoelectric materials) was used. When a surface of each of the thermoelectric materials of Examples 1-8 was observed with a scanning electron microscope at a magnification of 50 times, neither defects having a length of 800 μm or more nor defects having a length of 520 μm or more were present in the surface.

According to the embodiment of the present invention, it is possible to provide thermoelectric materials in which the properties (Seebeck coefficient, electric resistivity, and thermal conductivity) between the plurality of thermoelectric materials are uniformized to reduce variations, a manufacturing method thereof, a thermoelectric conversion element using the thermoelectric materials, and a thermoelectric conversion module using the thermoelectric materials by making the thermoelectric materials formed of a sintered body having less defects such as internal defects and appearance defects in the thermoelectric materials having a MgA-gAs type crystal structure. These thermoelectric materials constitute a thermoelectric conversion element, have a comparatively large output factor (the square of a Seebeck coefficient×an electric conductivity), and a sufficiently low thermal conductivity and exhibit a high dimensionless performance index ZT. By using thermoelectric materials as described above, it becomes possible to manufacture high-performance thermoelectric conversion elements and high-performance thermoelectric conversion modules, and the industrial value thereof is great.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:
1. A thermoelectric material comprising:
a sintered body formed of at least one of (1) a p-type thermoelectric material represented by a composition formula (1) and having a MgAgAs type crystal structure as a main phase and (2) an n-type thermoelectric material represented by the composition formula (1) and having a MgAgAs type crystal structure as a main phase, the sintered body having a relative density of 98.0% or more,

$$(Ti_{a1}Zr_{b1}Hf_{c1})_x\alpha_y\beta_{100-x-y} \tag{1}$$

wherein $0<a1\leq1$, $0<b1\leq1$, $0<c1\leq1$, $a1+b1+c1=1$, $30\leq x\leq35$, and $30\leq y\leq35$,
wherein an area ratio of internal defects by ultrasonic flaw detection in a thickness direction with respect to a surface parallel with one plane of the thermoelectric material is in a range of 2.9% to 10%, and no defect having a length of 520 μm or more is present in a surface of a chip of the thermoelectric material, the chip having a cube shape or a rectangular parallelepiped shape, wherein the cubic or rectangular parallelepiped chip has a length in a range of 2 to 10 mm, a width in a range of 2 to 10 mm, and a height in a range of 2 to 20 mm,
wherein in the n-type thermoelectric material, α is Ni, β is Sn, and 30 atomic % or less of β is substituted by at least one element selected from the group consisting of Si, Mg, As, Sb, Bi, Ge, Pb, Ga, and In,
wherein in the p-type thermoelectric material, α is Co, β is Sb, and 30 atomic % or less of β is substituted by at least one element selected from the group consisting of Sn, Si, Mg, As, Bi, Ge, Pb, Ga, and In, and wherein the thermoelectric material is processed into a shape of a chip through cutting.

2. The thermoelectric material according to claim 1, wherein in the composition formula (1), $0.2 \leq a1 \leq 0.7$.

3. The thermoelectric material according to claim 1, wherein a part of Ti, Zr, and Hf in the composition formula (1) is substituted by at least one element selected from the group consisting of V, Nb, Ta, Cr, Mo, and W.

4. The thermoelectric material according to claim 1, wherein a part of a in the composition formula (1) is substituted by at least one element selected from the group consisting of Mn, Fe, and Cu.

5. A manufacturing method of the thermoelectric material according to claim 1, the method comprising:
melting and casting an alloy which is a raw material of a sintered body of the thermoelectric material by a high frequency vacuum melting method to produce an ingot,
pulverizing the ingot to obtain powder particles,
sintering the powder particles by a sintering method without using a binder to form a sintered body of crystal particles, and
processing the sintered body into a predetermined shape by machining process in which no stress equal to or higher than a yield stress of the sintered body is applied to the sintered body during the processing of the sintered body.

6. The manufacturing method of the thermoelectric material according to claim 5, wherein the sintered body of the thermoelectric material is produced through sintering using a hot press method in which the sintered body is held at a pressuring force of 35 MPa or more, and at a temperature of 1200° C. or more for 1 hour or more and 10 hours or less.

7. The manufacturing method of the thermoelectric material according to claim 5, wherein the sintered body of the thermoelectric material is produced through sintering using a hot isostatic pressing method, and wherein a difference between a coefficient of linear thermal expansion of an encapsulant used in the sintering and a coefficient of linear thermal expansion of the thermoelectric material falls within a range of $\pm 5 \times 10-61$° C.

8. The manufacturing method of the thermoelectric material according to claim 5, wherein the sintered body of the thermoelectric material is produced by a sintering method in which an inside of the powder particles is caused to generate heat while being pressurized and is sintered.

9. The manufacturing method of the thermoelectric material according to claim 5, wherein the sintering method is a spark plasma sintering method.

10. The manufacturing method of the thermoelectric material according to claim 5, wherein the sintering method is a sintering method using millimeter wave heating.

11. The manufacturing method of the thermoelectric material according to claim 5, wherein when processing the sintered body in thermoelectric materials for one thermoelectric conversion element by machining process, the processing comprises cutting the sintered body by using a cutting blade with a blade thickness of 0.5 mm or less.

12. The manufacturing method of the thermoelectric material according to claim 5, wherein when processing the sintered body by machining process, the processing comprises cutting the sintered body by using a cutting blade with a blade thickness of 0.3 mm or less.

13. The manufacturing method of the thermoelectric material according to claim 5, further comprising:
when processing the sintered body by machine process, the processing comprises cutting the sintered body by a ultrasonically vibrating blade.

14. A thermoelectric conversion element comprising:
a p-type thermoelectric material and an n-type thermoelectric material that are connected in series,
wherein at least one of the p-type thermoelectric material and the n-type thermoelectric material comprises the thermoelectric material according to claim 1.

15. A thermoelectric conversion module comprising:
first electrode members arranged on a low temperature side;
second electrode members arranged on a high temperature side so as to face the first electrode members; and
a thermoelectric conversion element disposed between the first electrode member and the second electrode member and being electrically connected to both the first and second electrode members,
wherein the thermoelectric conversion element comprises p-type thermoelectric materials and n-type thermoelectric materials, the p-type thermoelectric materials and the n-type thermoelectric materials are alternately arranged and connected in series with the first and second electrode members, and at least one of the p-type thermoelectric materials and the n-type thermoelectric materials include at least one of the thermoelectric material according to claim 1.

16. The thermoelectric material according to claim 1, wherein a plurality of the chips of the thermoelectric material have a standard deviation of a dimensionless performance index ZT of 0.06 or less at absolute temperatures of 300K and 673K, wherein the dimensionless performance index ZT is a product of a performance index Z of the thermoelectric material multiplied by the absolute temperature T, and the dimensionless performance index Z is represented by a formula (2), $$Z = \alpha^2 \sigma / \kappa \tag{2}$$

wherein, in the formula (2), $\alpha$ is a Seebeck coefficient of the thermoelectric material, $\sigma$ is an electric conductivity of the thermoelectric material, and $\kappa$ is a thermal conductivity of the thermoelectric material.

17. A thermoelectric material comprising:
a sintered body formed of at least one of (1) a p-type thermoelectric material represented by a composition formula (1) and having a MgAgAs type crystal structure as a main phase, and (2) an n-type thermoelectric material represented by the composition formula (1) and having a MgAgAs type crystal structure as a main phase, the sintered body having a relative density of 98.0% or more, $$(Ti_{a1}Zr_{b1}Hf_{c1})_x \alpha_y \beta_{100-x-y} \tag{1}$$

wherein, in the composition formula (1), $0 < a1 \leq 1$, $0 < b1 \leq 1$, $0 < c1 \leq 1$, $a1+b1+c1=1$, $30 \leq x \leq 35$, and $30 \leq y \leq 35$, wherein an area ratio of internal defects by ultrasonic flaw detection in a thickness direction with respect to a surface parallel with one plane of the thermoelectric material is in a range of 2.9% to 10%, and a maximum length of appearance defects present at each vertex of a chip of the thermoelectric material is from 47 μm to 412 μm, wherein the chip has a cube shape or a rectangular parallelepiped shape, wherein the cubic or rectangular parallelepiped chip has a length in a range of 2 to 10 mm, a width in a range of 2 to 10 mm, and a height in a range of 2 to 20 mm, wherein, in the n-type thermoelectric material, α is Ni, β is Sn, and 30 atomic % or less of β is substituted by at least one element selected from the group consisting of Si, Mg, As, Sb, Bi, Ge, Pb, Ga, and In, wherein, in the p-type thermoelectric material, α is Co, β is Sb, and 30 atomic % or less of β is substituted by at least one element selected from the group consisting of Sn, Si, Mg, As, Bi, Ge, Pb, Ga, and In, and wherein the thermoelectric material is processed into the shape of the chip through cutting.

18. A thermoelectric material comprising:

a plurality of chips of a sintered body processed into a shape of the chip through cutting, the sintered body being formed of at least one of (1) a p-type thermoelectric material represented by a composition formula (1) and having a MgAgAs type crystal structure as a main phase and (2) a n-type thermoelectric material represented by the composition formula (1) and having a MgAgAs type crystal structure as a main phase, the plurality of chips having a relative density with an average value of 99.0% or more and a standard deviation of 0.5% or less, $$(Ti_{a1}Zr_{b1}Hf_{c1})_x\alpha_y\beta_{100-x-y}, \quad (1)$$

wherein $0<a1\leq1$, $0<b1\leq1$, $0<c1\leq1$, $a1+b1+c1=1$, $30\leq x\leq 35$, and $30\leq y\leq 35$, wherein an area ratio of internal defects by ultrasonic flaw detection in a thickness direction with respect to a surface parallel with one plane of each of the chips is in a range of 2.9% to 10%, and no defect having a length of 520 μm or more is present in a surface of each of the chips, each of the chips having a cube shape or a rectangular parallelepiped shape, wherein the cubic or rectangular parallelepiped chip has a length in a range of 2 to 10 mm, a width in a range of 2 to 10 mm, and a height in a range of 2 to 20 mm, wherein, in the n-type thermoelectric material, α is Ni, β is Sn, and 30 atomic % or less of β is substituted by at least one element selected from the group consisting of Si, Mg, As, Sb, Bi, Ge, Pb, Ga, and In, and wherein, in the p-type thermoelectric material, α is Co, β is Sb, and 30 atomic % or less of β is substituted by at least one element selected from the group consisting of Sn, Si, Mg, As, Bi, Ge, Pb, Ga, and In.

* * * * *